United States Patent [19]
Lund et al.

[11] Patent Number: 5,815,377
[45] Date of Patent: Sep. 29, 1998

[54] APPARATUS FOR AUTO DOCKING PCI CARDS

[75] Inventors: David George Lund, Byron; James Larry Peacock, Rochester; Scott Alan Shurson, Kasson, all of Minn.

[73] Assignee: International Business Machines Corporation, Armonk, N.Y.

[21] Appl. No.: 986,771

[22] Filed: Dec. 8, 1997

[51] Int. Cl.$^6$ .............................. H01R 13/629; H01R 4/50
[52] U.S. Cl. ......................... 361/802; 361/683; 361/741; 361/756; 361/785; 439/342; 439/347
[58] Field of Search .................................. 361/683, 684, 361/740, 741, 756, 785, 788, 801, 802; 439/62, 64, 157, 259, 310, 342, 347; 395/281–284

[56] References Cited

U.S. PATENT DOCUMENTS

| | | | |
|---|---|---|---|
| 5,317,481 | 5/1994 | Hills et al. | 439/259 |
| 5,478,251 | 12/1995 | Jaklin | 439/347 |
| 5,681,175 | 10/1997 | Busse et al. | 439/347 |

*Primary Examiner*—Leo P. Picard
*Assistant Examiner*—John B. Vigushin
*Attorney, Agent, or Firm*—Robert W. Lahtinen

[57] ABSTRACT

A hot docking mechanism enables a PCI type card with an edge connector to be inserted into an enclosure and docked in a card socket on the motherboard without operator access to the enclosure interior. A card holder carries the card and is supported on a card guide for sliding motion into the enclosure to a position at which the edge connector is aligned with the socket secured to the device motherboard. A camming assembly includes a sliding cam operable from outside the enclosure to convert horizontal sliding motion to vertical motion of the card into and out of the socket. The card holder is cammed out of the sliding support of the card guide during docking and returned to sliding support when the camming mechanism undocks the card. The card guide also comprises a rail that guides the card holder within the enclosure during both card docked and card undocked conditions. The card holder supports and enhances circuit card rigidity while the camming assembly, supported on the lower mother board surface beneath the socket, increases mother board rigidity during docking and undocking. The card is supported on the card holder and the camming connections are disposed at the longitudinal ends and aligned with the socket to minimize pitch and yaw during card docking and undocking.

15 Claims, 8 Drawing Sheets

APPARATUS FOR AUTO DOCKING PCI CARDS

FIELD OF THE INVENTION

The invention pertains to electronic packaging and more particularly to a structure and method for auto docking electronic cards.

BACKGROUND OF THE INVENTION

Peripheral component interface (PCI) printed circuit cards were originally designed for use with personal computers. The micro computer market is massive and provides the incentive for the creation of extensive numbers of applications, many of which are implemented on PCI cards. The use of PCI cards offers an opportunity to utilize a developed industry standard packaging technology and a wide ranging set of applications. The use of PCI cards in a different environment offers opportunities, but can be complicated by new requirements not present in personal computer applications. In mid sized or mini computers it is common to have continuous operation of the computer system. Thus, the installation or replacement of peripheral devices must be effected by hot plugging without disturbing system operation. However, PCI cards, in the normal environment, are installed when the device is shut down and the covers removed for card installation and removal. To realize the benefits of PCI card use, it is necessary to find a means to accomplish hot plugging of such cards while protecting the user from the electrical hazards of an operating, electrically energized system.

SUMMARY OF THE INVENTION

The problems associated with hot plugging of PCI cards is resolved using a card holder that slides into the enclosure prior to electrical connection. The card is aligned with the connector when fully inserted and is thereafter cammed into the cooperating connector. The camming assembly is mounted at the reverse side of the mother board where it provides support and additional rigidity to the mother board during insertion and removal of the PCI card.

The card holder includes hook portions that engage the camming assembly at each longitudinal end of the connector on the mother board and are offset from the plane of the card holder such that engagement with the camming assembly occurs in the plane of the PCI card. This alignment minimizes pitch and yaw as the card is cammed down or up. A sliding cam member, operable from the exterior of the enclosure, engages the card holder and converts horizontal motion of the sliding cam into vertical motion of the card holder to install the card into and remove the card from the aligned socket on the mother board.

The card/card holder assembly slides into the enclosure using a card guide which includes a center rail which guides the card holder and crimped flanges on each side of the center rail that support the card holder during insertion into the enclosure and removal from the enclosure. The card holder, during insertion of the card into the socket, is withdrawn from the sliding support of the card guide. To reduce the force necessary to withdraw the card holder from the card guide, the crimped flanges are notched to present short segments aligned with the card holder carriers when the card holder is inserted to the position at which the card edge connector is aligned with the socket. Thus, only short sections of the flanges must be displaced to release the card holder carriers from the card guide. This also equalizes the resistance at each end of the socket as equal lengths of the flanges are displaced. The flanges are also inclined outwardly at the lower marginal edges to guide the carriers back into the card guide when the card holder is cammed upward to remove the card edge connector from the socket. This insertion and removal is made possible by the center rail that continues to guide the card holder carriers within the enclosure even when the carriers are cammed out of the supporting relation with the card guide flanges.

DETAILED DESCRIPTION

Figure 1:
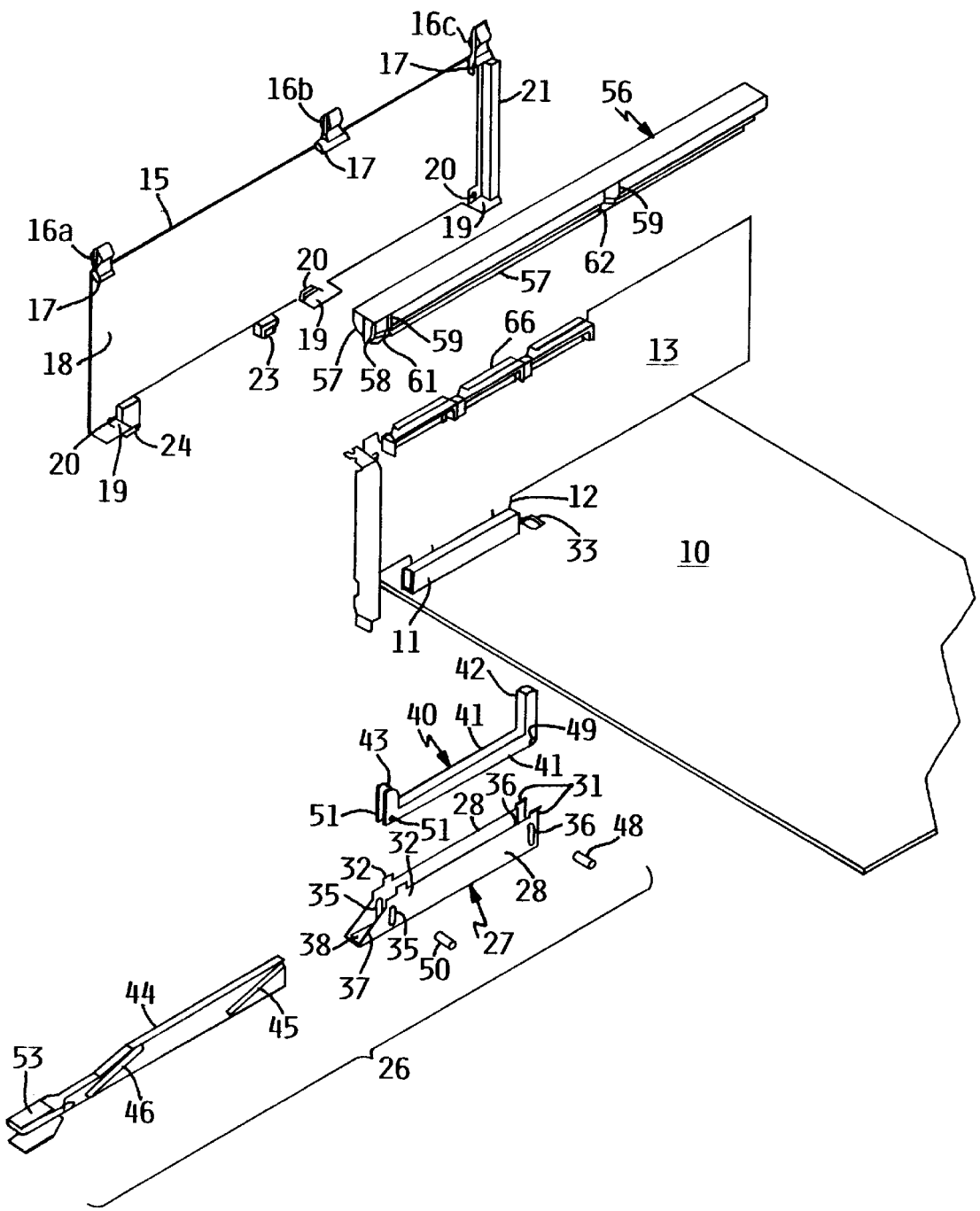
FIG. 1 is an exploded view of the card holder, card guide and sliding cam assembly of the present invention and a PCI card and mother board with which the docking assembly cooperates

FIG. 1 is an exploded view of the parts of the card docking apparatus of the present invention and the mother board 10 with the connector 11 mounted thereon which receives the card edge connector 12. The PCI card 13 is carried by the card holder 15. Card holder 15 has three bifurcated carriers 16a, 16b, and 16c formed along the upper edge. Each of the carriers 16a, 16b, and 16c presents a downwardly facing slot 17, spaced from the card holder surface 18, which receives and supports the upper edge of the card 13. A series of three projections 19 present upwardly facing slots 20 which are spaced from the card holder surface 18 and receive and support the lower edge of PCI card 13. At the rear of card holder 15 a stop bar 21 is mounted which functions as a stop for the alignment of a full length PCI card supported on the card holder. Formed integrally with card holder 15 are a forward hook 23 and a rear hook 24 which are offset from the card holder wall surface 18 and in alignment with card 13 mounted on the card holder.

Figure 1A:
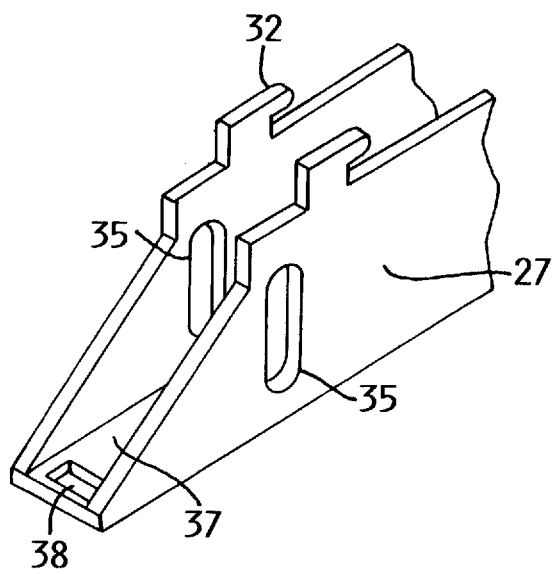
FIG. 1A is a partial detail view of the sliding cam assembly housing showing the detent opening.
Figure 4:
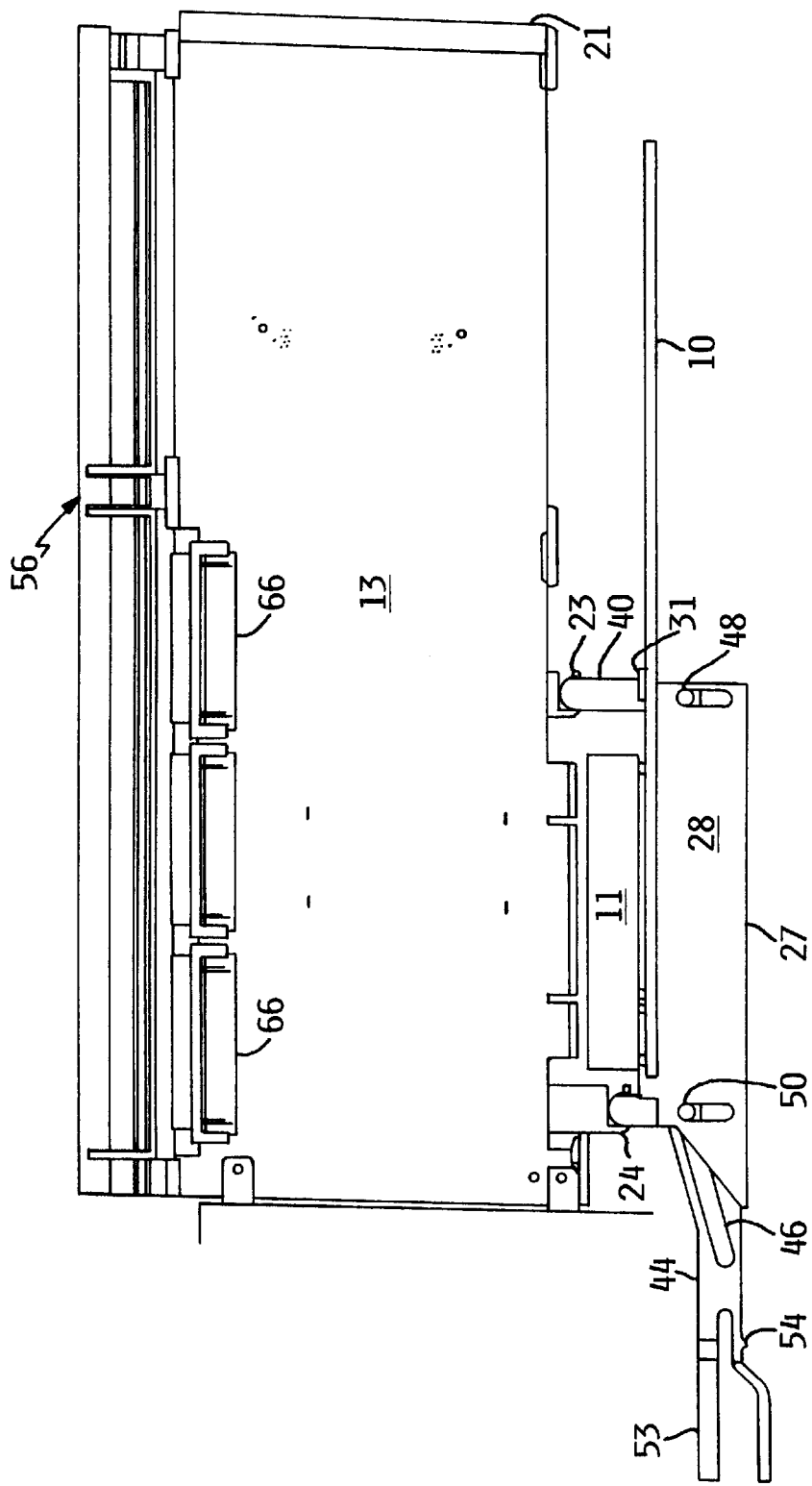
FIG. 4 is a side elevation of the docking assembly of the present invention and cooperating mother board and card socket with the card fully inserted into the enclosure and prior to camming the card into the socket.

The sliding cam assembly 26 includes a channel shaped housing 27 with flanges 28 and a bight portion 37. The flanges 28 carry forward hooks 31 that extend through the opening 33 in mother board 10 and rearward hooks 32 which extend over the edge of the motherboard to retain the assembly against the board lower surface. The housing flanges 28 also each include vertical slotted openings 35 and 36 and the bight portion 37, that connects the flanges, includes a detent opening 38 (see FIG. 1A). The vertically reciprocating clamping member 40 is formed of a pair of U-shaped, parallel plates 41 which are secured to and separated by pins 42 and 43. A sliding cam 44 includes inclined slotted openings 45 and 46 which effect the camming action that causes clamping member 40 to move vertically as the sliding cam 44 moves horizontally. Sliding cam 44 is positioned between clamping member plates 41 and housing flanges 28. Pin 48 is supported in the openings 49 in clamping member 40, passing through sliding cam inclined slot 45 and projecting at each end into housing flange slots 36. Similarly, pin 50 is supported in clamp member openings 51, extends through sliding cam inclined slot 46 and has projecting ends received in housing flange slots 35. The exposed end of the sliding cam 44 includes a bifurcated handle portion 53 and a detent projection 54 (FIG. 4). The detent projection 54 resides in the housing bight portion detent opening 38 when the sliding cam is fully inserted into the balance of the cam assembly. Pinching together the elements of the bifurcated handle 53 withdraws detent projection 54 from the detent opening 38 to enable withdrawal of the cam and raising of the card holder assembly.

In operation, as the sliding cam 44 is pressed into the housing 27, the upper surfaces of the inclined slotted openings 45 and 46 respectively engage pins 48 and 50 to cause the clamping member 40 to lower vertically as the pins 48 and 50 move downwardly in slotted openings 36 and 35. Similarly, withdrawal of the sliding cam 44 from housing 27 causes clamping member 40 to rise as the lower surfaces of inclined slotted openings 45 and 46 drive pins 48 and 50 upwardly in the respective slotted openings 36 and 35.

Figure 1B:
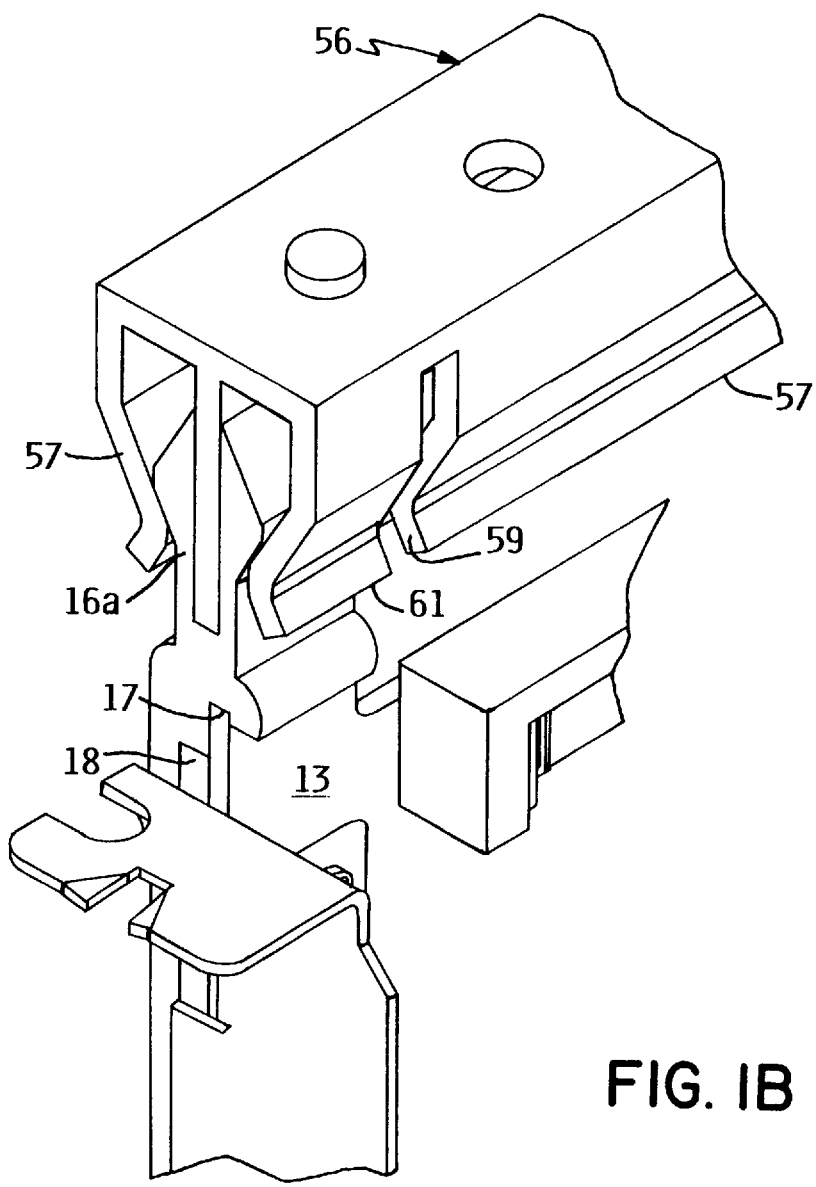
FIG. 1B is a partial view of the end of the card holder and card guide showing the structure in enlarged form.

PCI card 13, mounted on the card holder 15, is inserted into the enclosure in unison with the card holder as the bifurcated carriers 16a, 16b and 16c are guided along the card guide 56. As shown in greater detail in FIG. 1B, the carriers 16a, 16b and 16c are supported by and slide on the crimped outer flanges 57 and are guided by the continuous center rail 58 which is received between the bifurcated portions of the carriers. The outer flanges 57 include notches 59 to provide short card guide flange portions 61 and 62 that are substantially the same length as the carriers 16a and 16b and respectively aligned with those carriers when the card holder is in the fully inserted position. Further, when the card holder is fully inserted, the carrier 16c is beyond the end of the crimped flanges 57, although still guided by the continuous center rail 58. Thus, when the card is docked by being cammed downward, the carrier 16c is not constrained by engagement with the crimped card guide flanges 57 and the carriers 16a and 16b are aligned with the short flange portions 61, 62 respectively, requiring that only such shortened flange portions be deflected to release the carriers as the card holder is cammed downward.

Figure 2:
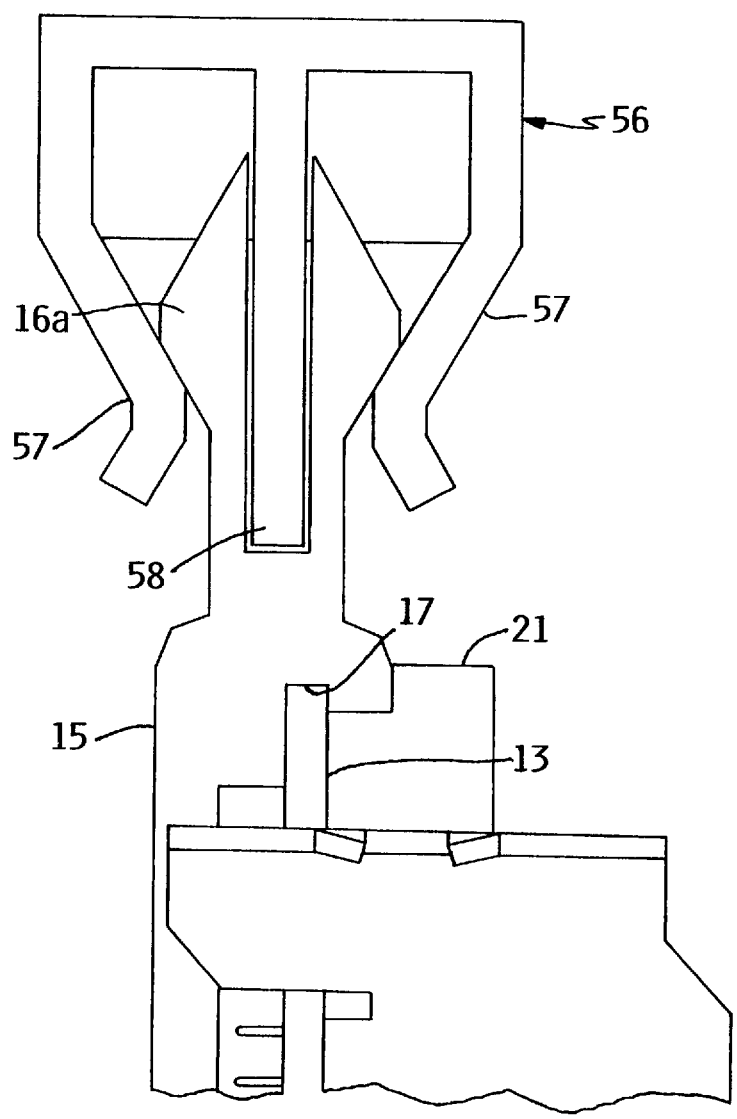
FIG. 2 is an enlarged partial end view of the card holder and card guide with the card holder carriers supported on the outer flanges.
Figure 3:
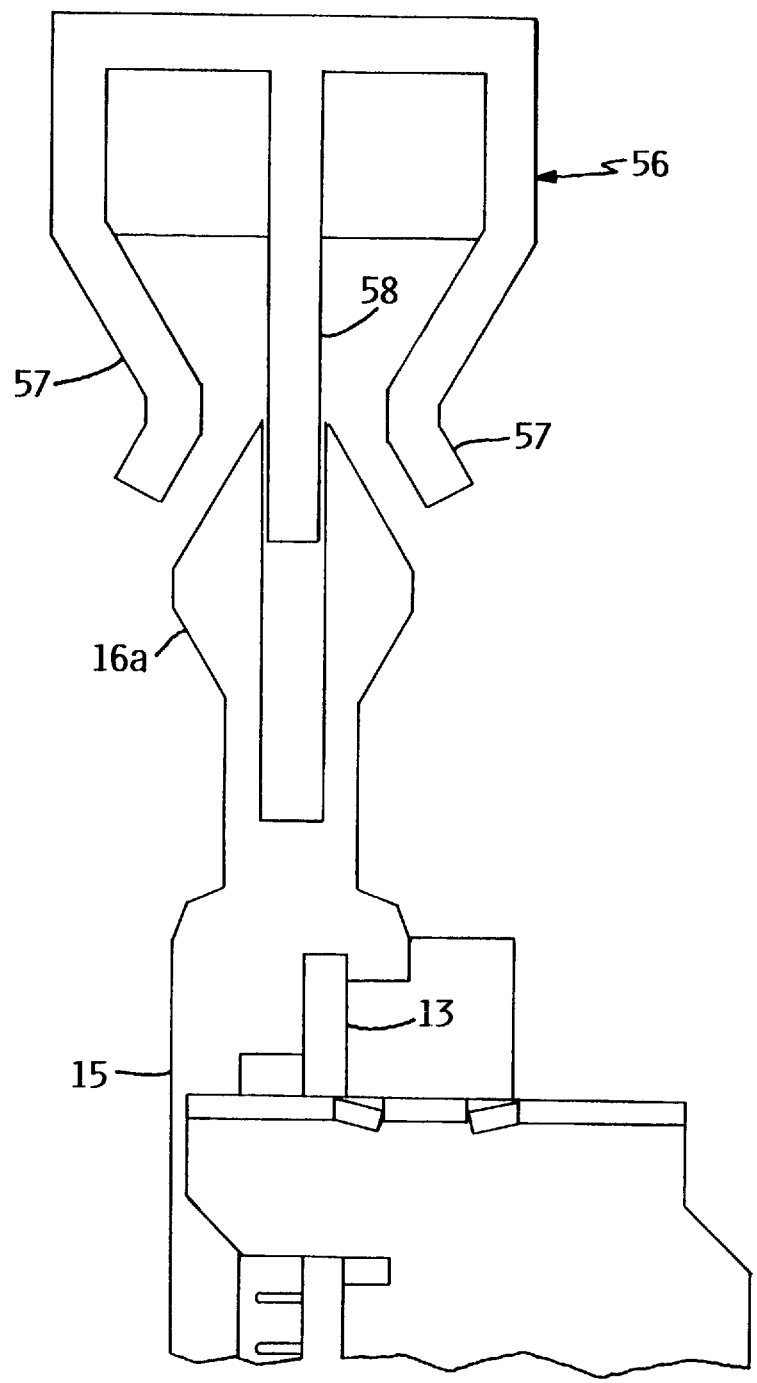
FIG. 3 is a view similar to FIG. 2, but with the cardholder carrier cammed out of supporting engagement with the outer flanges, but still guided by the center rail.

FIG. 2 illustrates the card guide 56 supporting the carrier 16a with crimped flanges 57 and guiding carrier 16a using the continuous center rail 58. FIG. 3 shows the apparatus of FIG. 2 following docking of the PCI card. The card holder 15 and carrier 16a have been cammed downward such that the carrier is no longer supported by the flanges 57, but the carrier is still retained by the center rail 58 which in the docked position still extends into the groove that separates the bifurcated portions of carrier 16a.

Figure 5:
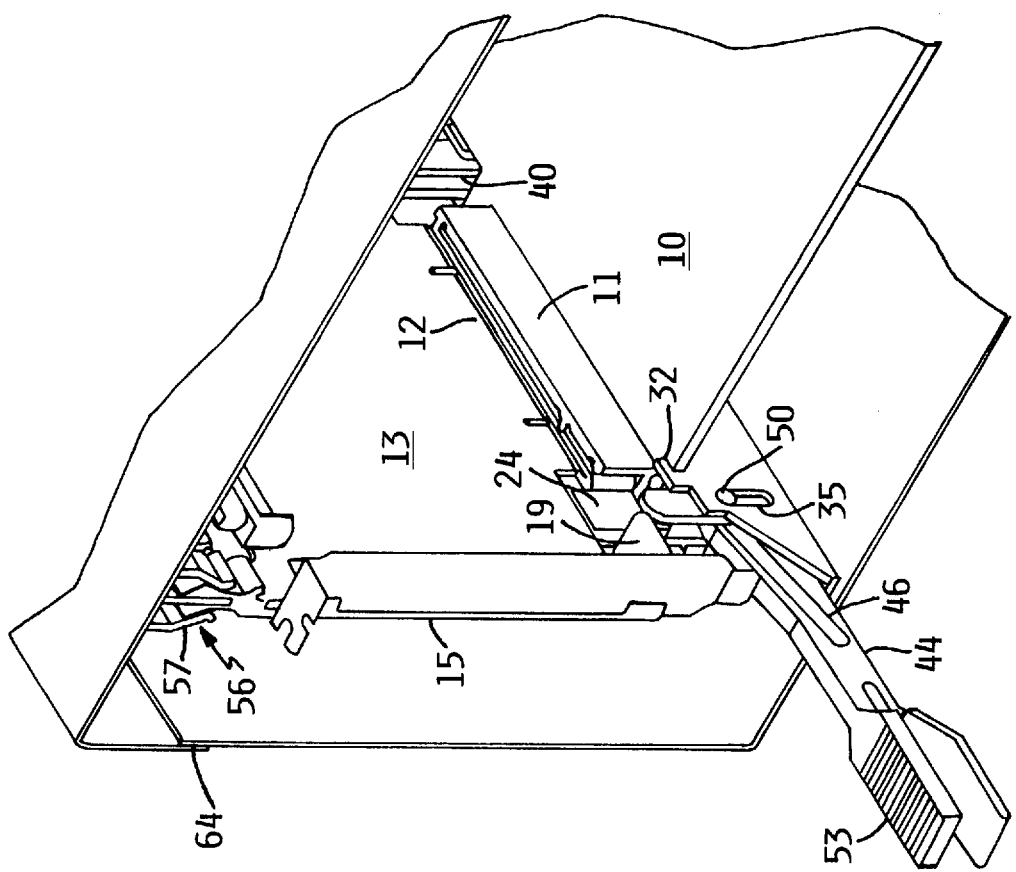
FIG. 5 is a perspective view of the apparatus of FIG. 4, further including the device enclosure and showing the card guide attached to the top of the enclosure.

FIGS. 4 and 5 show the card holder 15 fully inserted into the device enclosure 64 prior to camming the card 13 downward into the connector 11 supported on mother board 10. In the fully inserted position, the card holder hooks 23 and 24 have respectively captured clamping member pins 42 and 43 (FIG. 1) that extend between the parallel plates 41 of clamping member 40. As the card and card holder assembly slide into the surrounding enclosure 64, the hook 23 moves over the connector 11 to engage the clamping member pin 42 and the card edge connector 12 is positioned in an aligned, overlying relationship with respect to connector 11. The hooks 23 and 24 and clamping member 40 are aligned with the plane of card 13 and are positioned to apply the insertion and removal forces at each longitudinal end of the connector 11 and card edge connector 12. The supporting carriers 16a and 16b (carrier 16c no longer being constrained by the crimped flanges 57) are also disposed at each longitudinal end of the cooperating connector elements 11 and 12, while the carriers 16a and 16b are offset from the card holder surface 18 to be more nearly aligned with the plane of the supported card 13. Thus, when the card 13 is docked and undocked, pitch and roll are minimized.

As viewed in FIGS. 4 and 5, the card holder 15 and the PCI card 13 supported thereon have been fully inserted into the enclosure 64, but electrical connection has yet to be effected.

Figure 6:
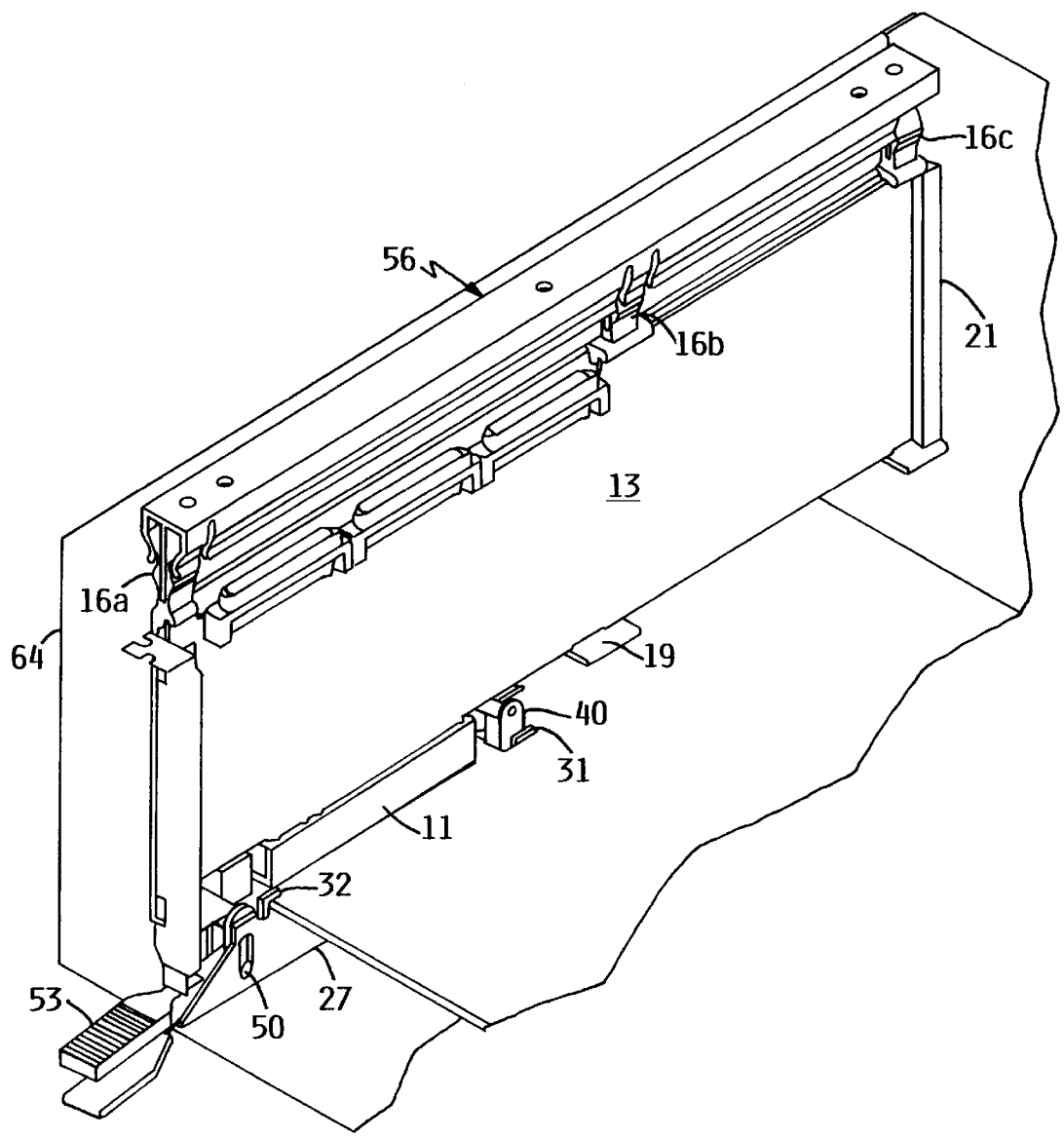
FIG. 6 is a view similar to FIG. 5 with the upper enclosure portion removed and the card cammed into the socket.

The sliding cam 44 may now be moved into the cam assembly housing 27 causing the angled camming slots 45 and 46 to engage the pins 48 and 50 to drive the clamping member 40 downward, inserting the card edge connector 12 into the cooperating connector 11. When the sliding cam 44 is fully inserted into the housing 27, as shown in FIG. 6, the detent 54 will drop into the housing detent opening 38 (FIG. 1A) to assure retention of the card edge connector 12 in connector 11.

The mounting of the sliding cam assembly 26 against the lower surface of the mother board 10 adds support and rigidity to the mother board. The use of the card holder 15 also adds support and rigidity to the card 13 to avoid deflection during card docking. The card is not electrically activated until after full insertion into the enclosure and the protective covers are not removed to expose areas of electrical potential during card docking and undocking.

Although the invention has been shown using a PCI long card, the apparatus is adapted to be used with cards of various size and specifically with an alternate size such as the industry standard short card. The card 13 is mounted on the card holder 15 with the solder side facing the card holder surface 18 and the component side facing away from the card holder. The design of the docking apparatus further accommodates the use of card top connectors 66 (FIGS. 1, 4, and 6). The carriers 16a and 16b are positioned to be at opposite longitudinal ends of one or more card top connectors that may be present on a standard PCI card.

While the invention has been shown and described with respect to a preferred embodiment, it will be understood by those skilled in the art that changes in the form and detail may be made without departing from the scope and teaching of the invention. Accordingly, the apparatus herein disclosed is to be considered illustrative and the invention is to be limited only as specified in the claims.

What is claimed is:

1. In an electrical apparatus wherein a mother board is supported within an enclosure and has a card socket for receiving a circuit card connector, mounted on one surface thereof, a circuit card docking apparatus for installing a circuit card in said card socket from the exterior of said enclosure comprising a circuit card holder;

a circuit card mounted on said circuit card holder and presenting a connector at one edge thereof;

card guide means mounted within said enclosure for slidably supporting and guiding said card holder into said enclosure to a position whereat said circuit card connector is aligned with said card socket;

camming means supported on said mother board at the surface opposite said one surface and aligned with said socket;

means for connecting said camming means to said card holder when said circuit card mounted on said card holder is aligned with said socket; and said camming means includes a cam mechanism operable from exterior of said enclosure to move said card holder toward said mother board and insert said connector into said socket.

2. The circuit card docking apparatus of claim 1 wherein said cam mechanism is reversible, movable in one direction to insert said card connector into said socket and movable in the opposite of said one direction to remove said connector from said socket.

3. The circuit card docking apparatus of claim 2 wherein said card guide means includes a central guide rail and flanges at either side thereof that incline toward said central guide rail and said card holder includes bifurcated carriers which extend into said card guide means with said central guide rail disposed between the bifurcated portions of said carriers and the inclined flange surfaces supporting said carriers.

4. The circuit card docking apparatus of claim 3 wherein said flanges at either side of the central guide rail present said inclined surfaces that support said card holder carriers along an intermediate portion of said flanges and have marginal edge portions with surfaces confronting said central guide rail that incline away from said guide rail.

5. The circuit card docking apparatus of claim 3 wherein said circuit card mounted on said circuit card holder is supported by said card holder at a plurality of locations along the upper edge and at a plurality of locations along the lower edge.

6. The circuit card docking apparatus of claim 5 wherein said plurality of locations of support along said upper edge are respectively vertically aligned with said carriers.

7. The circuit card docking apparatus of claim 3 wherein said means for connecting comprises hook elements carried by said card holder and pins carried by said camming means, positioned adjacent each longitudinal end of said card socket and respectively engageable with said hooks when said card holder has positioned said circuit card to align said card connector with said socket.

8. A docking apparatus for inserting a circuit card, with an edge connector, into an enclosure and inserting said edge connector into a socket mounted on a motherboard without operator access to the enclosure interior, comprising card holder means having said circuit card mounted thereon for movement in unison therewith;

card guide means which slidably supports said card holder means for sliding movement of said card holder from the exterior of said enclosure to the interior of said enclosure to a position where said edge connector is aligned with said socket;

camming means operable from the exterior of said enclosure; and connecting means for interconnecting said card holder and said camming means when said card holder is positioned to align said edge connector with said socket, said camming means including a camming element movable from a first position to a second position to insert said edge connector into said socket and remove said card holder from a position of sliding support by said card guide means.

9. The docking apparatus of claim 8 wherein said camming means is reversible such that moving said camming element from said second position to said first position removes said edge connector from said socket and restores said card holder means to a position of slidable support by said card guide means.

10. The docking apparatus of claim 9 wherein said card guide means further comprises a guide rail that guides said card holder means when slidably supported by said card guide means and when said edge connector is inserted in said socket with said card holder means removed from a position of sliding support.

11. The docking apparatus of claim 8 wherein said camming element includes camming surfaces which function to convert horizontal movement of said camming element into vertical movement of said card mounted on said card holder, whereby motion of said camming element into said enclosure causes said card edge connector to be inserted into said socket and motion of said camming element outward from said enclosure withdraws said edge connector from said socket.

12. The docking apparatus of claim 11 wherein said camming means further includes releasable detent means for retaining said camming element in the fully inserted position and the card edge connector in said socket.

13. The docking apparatus of claim 9 wherein said card holder includes a plurality of bifurcated carrier elements and said card guide comprises a guide rail received between the bifurcated portions of said carriers and a pair of flange members at opposite sides of said guide rail, each of said card guide flange members having a first surface inclined toward said guide rail that provides slidable support for said carrier elements and a second surface that is inclined away from said guide rail whereby said carriers may be guided back to a position of slidable support by said flange first surfaces when said camming element removes said edge connector from said socket.

14. The docking apparatus of claim 13 wherein said removal of carrier elements from slidable support by said flange member first surfaces and restoring said carriers to a position of slidable support by said flange member first surfaces is accomplished by deflecting said flange members away from said guide rail and said flange members are slotted to present short lengths of said flange members aligned with said card holder carriers when said card holder is positioned to align said card edge connector with said socket, whereby camming said card into and out of said socket requires that only said short lengths of said flange members be deflected.

15. The docking apparatus of claim 14 wherein said short lengths of said flange members are substantially aligned with and symmetrically positioned above and at each axial end of said socket.

* * * * *